(12) United States Patent
Skelton et al.

(10) Patent No.: US 7,927,385 B2
(45) Date of Patent: Apr. 19, 2011

(54) PROCESSING OF FINE SILICON POWDER TO PRODUCE BULK SILICON

(75) Inventors: Dean Skelton, Fitzwilliam, NH (US); Bernard Jones, Leonding (AT); Santhana Raghavan Parthasarathy, Nashua, NH (US); Chandra P. Khattak, Nashua, NH (US)

(73) Assignee: GT Solar Incorporated, Merrimack, NH (US)

( * ) Notice: Subject to any disclaimer, the term of this patent is extended or adjusted under 35 U.S.C. 154(b) by 108 days.

(21) Appl. No.: 12/130,550

(22) Filed: May 30, 2008

(65) Prior Publication Data
US 2008/0295294 A1    Dec. 4, 2008

Related U.S. Application Data

(60) Provisional application No. 60/932,824, filed on Jun. 1, 2007.

(51) Int. Cl.
*C01B 33/037* (2006.01)
*B01D 9/00* (2006.01)
*C01B 33/021* (2006.01)

(52) U.S. Cl. ..................... 23/295 R; 423/349

(58) Field of Classification Search .......... 423/324–350; 23/295 R
See application file for complete search history.

(56) References Cited

U.S. PATENT DOCUMENTS

| | | | | |
|---|---|---|---|---|
| 4,659,421 A * | 4/1987 | Jewett | .............................. | 117/21 |
| 4,676,968 A * | 6/1987 | Sanjurjo et al. | ................ | 423/350 |
| 2006/0048698 A1 * | 3/2006 | Hall et al. | ........................ | 117/54 |
| 2006/0219162 A1 * | 10/2006 | Parthasarathy et al. | ........ | 117/208 |
| 2008/0035051 A1 * | 2/2008 | Schmid et al. | ................... | 117/74 |
| 2008/0053372 A1 * | 3/2008 | Anttila et al. | .................. | 117/200 |
| 2009/0188427 A1 * | 7/2009 | Mueller et al. | ................. | 117/223 |
| 2009/0206233 A1 * | 8/2009 | Parthasarathy et al. | ........ | 249/115 |

FOREIGN PATENT DOCUMENTS

| | | |
|---|---|---|
| CA | 2 355 862 | 6/2000 |
| JP | 10-245216 | 9/1998 |

OTHER PUBLICATIONS

PCT International Search Report mailed on Sep. 4, 2008, PCT/US2008/065273.

* cited by examiner

*Primary Examiner* — Wayne Langel
*Assistant Examiner* — Syed Iqbal
(74) *Attorney, Agent, or Firm* — Edwards Angell Palmer & Dodge LLP

(57) ABSTRACT

A method for using substantial quantities of silicon powders as charge and processing it to produce a high quality silicon ingots suitable for photovoltaic use is disclosed. In a fused silica crucible, silicon feedstock containing more than about 5% by weight silicon powder is charged. The crucible with the charged silicon feedstock is placed into a furnace chamber and a vacuum is drawn to remove air. The vacuum is applied slowly. Then, the furnace chamber is backfilled with argon gas and heated to form molten silicon. Afterward, the molten silicon is solidified and annealed to form a multicrystalline silicon ingot.

14 Claims, No Drawings

PROCESSING OF FINE SILICON POWDER TO PRODUCE BULK SILICON

CROSS-REFERENCE TO RELATED APPLICATION

This application claims the benefit of application U.S. Provisional Application Ser. No. 60/932,824 filed on Jun. 1, 2007, the disclosure of which is expressly incorporated herein by reference in its entirety.

BACKGROUND OF THE INVENTION

The photovoltaic (PV) industry is undergoing rapid growth with shipments of more than 2.5 GW of PV modules in 2006. This represents about a 40% growth rate for last year, and it is projected that worldwide shipments of PV modules will increase by about 40-50% per year rate to over 10 GW (giga watts) per annum in 2010. Therefore, the PV industry has grown steadily to a critical size to be considered as an important industry. More than 90% of worldwide production of PV modules uses crystalline silicon; amorphous silicon and thin film technologies constitute less than 10% of the production with the majority of it for consumer electronics applications.

Even though the PV industry has matured, it has relied on the electronic industry for its silicon feedstock. Up until recently, excess capacity, rejects and scraps from the electronic industry were used as feedstock. For the electronic industry, the cost of silicon wafers is less than 5% of the device cost, whereas for the PV industry it is about 30% of the module cost. Therefore, it is important to have a low-cost solar grade (SoG) silicon feedstock for the PV industry. If an independent low-cost source of SoG silicon becomes available, the growth of the PV industry can increase at a faster rate.

The rapid growth of the PV industry, absence of an independent source of SoG silicon and reluctance to add additional capacity by major electronic grade silicon feedstock manufacturers has created a shortfall in the supply of silicon feedstock for the PV industry. Therefore, the PV industry has had to resort to using lower and lower grades of silicon feedstock to meet its needs. Fortunately, the purity of silicon feedstock for solar cells is more forgiving as compared to most microelectronic devices.

Silicon feedstock for electronic applications (EG silicon feedstock) utilizes extensive chemical processing. With this approach, all impurities are reduced to <1 ppba level. Most solar cell processing requires silicon with about 0.5 ppma boron (B). Therefore, B dopant is added when EG silicon feedstock is used. It is also recognized that high efficiency solar cells can be produced even when metallic impurities are in the 0.1 ppma range. In view of these criteria, the SoG silicon feedstock can contain higher levels of impurities than EG silicon feedstock without compromising solar cell performance. In addition to metallic impurities, solar cells are also somewhat tolerant to finely dispersed secondary phases, such as, oxides, carbides, etc.

The production of EG silicon feedstock is by reduction of chloro-silanes. The most commonly used process involves reduction of trichlorosilane in a Siemens reactor. Another approach is silane reduction in a fluidized bed reactor (FBR). The latter approach offers lower production costs and is, therefore, attractive for large volume production especially for PV applications. The FBR produces a more desirable bead size product compared to the large chunk size product from the Siemens reactor. Although most of the silicon is produced as beads in the fluidized bed, approximately 10% of the silicon is deposited in a very fine powder form on the walls of the reactor. A smaller amount of silicon powder is also carried by the outgoing gas stream and is trapped in the on-line filters. Chemically, these silicon powders are similar, with respect to the metallic impurities, to the silicon beads product but these powders range from submicron size to a few micron sizes. The large surface area of the powders (due to fine particle size) can lead to surface contamination from deposition on the surface, handling and exposure to the ambient environment. Typically, transition metal impurity contamination and oxidation of the surface can be expected. When such fine powders are used as wafers for an ingot growth process (such as multicrystalline ingot production) many problems are encountered, for example, (1) poor packing density of the powder in the crucible, (2) transport of the powder from the crucible into the heat zone during evacuation, (3) reaction of the powder in the hot zone to form carbides, (4) problems with melting if sufficient higher melting oxides/carbides are formed, (5) separation of the oxide/carbide slag from the silicon melt, (6) reduction of impurities during the solidification of the silicon, and (7) utilization of the product for PV applications. The present invention relates to resolving or reducing some of the problems encountered in using such silicon powder.

For several years efforts have been made to utilize the fine powder that has been a by-product from the FBR for PV applications. When attempts were made to melt these powders in resistively heated furnaces, it was difficult to even melt the charge at temperatures in excess of the melting point of silicon (1412° C.). This was attributed to (i) an oxide layer covering the silicon particles due to exposure to air or (ii) to carbide formation during heating in the furnaces. Both silicon oxide and silicon carbide have significantly higher melting temperatures than silicon. When attempts were made to mix the powders with bulk silicon feedstock, the solar cell performance was degraded. Hence most of the powder ended up being used by the metals industry rather than for electronic devices.

In order to extend the supply of silicon feedstock in the current shortfall situation, utilization of these powders has been re-examined. It is generally agreed that, if the powders comprise more than about 5% of the feedstock charge by weight, serious degradation of solar cell performance can be expected. Therefore, it has been debated whether it is worth risking 95% of the bulk material in this shortage environment for silicon feedstock because some of the powders have been contaminated in their handling as a by product of the FBR bead production.

SUMMARY OF THE INVENTION

The present invention provides a method for using substantial quantities of silicon powders as charge and processing it to produce a high quality silicon ingots suitable for PV use while minimizing the affect of oxide and carbide impurities, and of metallic impurities. Thus, the resulting bulk silicon powder can be used as feedstock for PV applications. In accord with one embodiment of the present invention, a method for making multicrystalline silicon ingots suitable for photovoltaic use comprises providing a fused silica crucible, charging the crucible with silicon feedstock comprising more than about 5% by weight silicon powder, placing the crucible with the charged silicon feedstock into a furnace chamber, drawing a vacuum on the furnace chamber to remove air, the vacuum being applied slowly, e.g., preferably reducing the pressure in the range of about 8-15 mBar/min, heating the furnace chamber, crucible and silicon feedstock, backfilling the furnace chamber with argon gas, continued heating the furnace chamber, crucible and silicon feedstock to completely melt silicon, solidifying the molten silicon to form multicrystalline silicon, annealing the muticrystalline silicon ingot and cooling it. To avoid cracking of the muticrystalline silicon ingot, the crucible is preferably coated with silicon nitride.

Preferably, the argon is directed at the crucible to provide a continuous flow of argon past the charged silicon feedstock. Graphite plates are provided to form a box to support the fused silica crucible on the bottom and sides. In accord with a preferred embodiment of the invention, a graphite top plate also is provided for the crucible, the top plate having a central opening. Smaller openings also are provided in the side plates with passageways to the openings for exit flow of the argon entering the box through the top plate opening. For better flow of argon through the box, graphite tubes are used to direct argon from the injection point in the furnace chamber to the opening in the top plate.

In another embodiment of the invention, a method for making multicrystalline silicon ingots comprises providing a fused silica crucible, charging the crucible with silicon feedstock comprising more than about 5% by weight silicon powder, placing the crucible with the charged silicon feedstock into a furnace chamber, drawing a vacuum on the furnace chamber to remove air, the vacuum being applied slowly, e.g., preferably reducing the pressure in the range of about 8-15 mBar/min, heating the furnace chamber, crucible and silicon feedstock to completely melt silicon, and solidifying the molten silicon to form multicrystalline silicon.

DETAILED DESCRIPTION OF THE INVENTION

One of the most widely used furnaces for producing multicrystalline silicon ingots for PV applications is DSS (Directional Solidification System) furnaces supplied by GT Solar Incorporated, Merrimack, N.H. Examples cited here use the DSS furnaces, however, it will be obvious to one skilled in the art that similar procedures can be used with other furnaces supplied or used in the industry.

A typical cycle for production of multicrystalline silicon ingots in a DSS furnace involves loading the silicon feedstock with appropriate dopant in a slip cast, fused silica crucible coated with a silicon nitride based layer to prevent cracking of the silicon ingot product. A typical crucible can be obtained from Vesuvius as a commercial product with square cross section of approximately 69 cm inside wall to wall dimension and is used in the PV industry to produce 240 to 310 kg silicon ingots. The inside surfaces of the crucible are typically spray coated with a silicon nitride layer and fired in a kiln to attach the silicon nitride layer to the silica crucible. In use, the crucible and its silicon feedstock are supported by graphite plates on all sides and bottom to form a box around the crucible to provide support for the silica at high temperatures when processing the feedstock to form a multicrystalline silicon ingot. The silicon feedstock, dopant, silica crucible and graphite box are loaded into the DSS furnace. After going through a check out procedure the furnace chamber is evacuated and heat applied via the graphite resistance heating element. The furnace and charge are heated under vacuum to approximately 1200 C. Then, the furnace chamber is back-filled with argon gas to about 600 mbar. At higher temperatures under vacuum the silicon nitride coating is not stable. Further heating of charge is continued under argon and the silicon charge is melted in the crucible. The melt is stabilized with the furnace temperature above the melting point of silicon and the vertical insulation is raised to impose radiant cooling from the bottom of the crucible. Silicon directional solidification is achieved by solidification from the bottom towards the top of the melt. After complete solidification is achieved the furnace temperature is reduced below the melting point of silicon; the gradient imposed during growth is gradually reduced by lowering the vertical insulation. Under these conditions the silicon ingot is annealed to reduce thermal stress imposed during growth and also to reduce the defect density in the silicon ingot. Thereafter, the ingot is cooled in the DSS furnace.

The above mentioned typical procedure will produce 240 to 270 kg silicon ingots in the 69 cm×69 cm, square cross section fused silica crucibles using bulk silicon feedstock. However, when fine powder feedstock is used as charge, depending on the range of size of the powder, only about 100 to 140 kg powder fills up the same crucible. For a batch process such as one under discussion it is important to keep the batch size as high as possible in order to reduce costs. Therefore, when loading powder into the crucible, 5 to 10 kg preferably is loaded at a time, spreading the powder and tapping of the crucible helped increase the packing density and allow more silicon powder to be loaded in the crucible. In a production environment, a vibrating table also can be used instead of or in combination with manual spreading of powder and tapping of the crucible. Instead of using 100% silicon powder, bulk silicon in the form of wafers, sections or bars, in whole or broken form, can be added to the crucible after it has been loaded with the desired quantity of powder charge. The additional silicon pieces provide a cover over the powder charge and also increase the effective packing density and increase the batch size. In accord with the present invention, at least more than about 5% by weight of silicon powder is used to charge the crucible, preferably at least about 10%, more preferably at least about 20%, and most preferably at least about 50%. For purposes of the present invention, silicon powder is particulate silicon having irregular form and a size of less than about 20 microns, preferably less than about 10 microns.

Typically, the crucible is loaded into the DSS furnace without a cover. With powder charge, it is preferred to use a graphite crucible cover with a central hole, which is installed before the crucible is loaded into the DSS furnace. Smaller holes are made in the graphite side plates. When a cover is used in accord with certain embodiments of the present invention, additional modifications preferably are made in the DSS furnace so that the argon introduced into the chamber is directed towards the central hole in the crucible cover. The argon exits the crucible support box through small holes in the side plates to provide a continuous flow. When using a silicon nitride coated crucible, it is important that the silicon charge be kept under an argon blanket during processing. Preferably, graphite tubes are added to the furnace chamber to direct the argon from the normal injection point in the chamber to near the central hole of the crucible cover.

After the crucible and charge are loaded in the DSS furnace, in a typical embodiment, the furnace chamber is evacuated with a vacuum pump and blower. With standard conditions the powder from the crucible will be sucked out of the crucible into the furnace chamber. Thus, when using powder, the initial pump down of the chamber preferably is slowed and, as the pressure in the chamber decreases, the orifice for evacuation can be opened further. In addition to evacuating the chamber, the air trapped in the powder charge has to be reduced. Thus, the evacuation time, for example to reduce pressure from about 1000 mBar to about 100 mBar should be increased to at least two times the conventional evacuation time, preferably, three to five times the conventional evacuation time particularly for smaller particle size fine powder, e.g., when there are many particles a few microns in size. The rate of evacuation should be no greater than that required to reduce the pressure about 15 mBar/min., preferably, about 12 mBar/min., more preferably about 8 mBar/min. When the charge in the crucible is covered with silicon wafers/sections in the crucible, a higher evacuation rate can be used than that used without such cover. Use of a cover for the crucible permits increasing the evacuation rate. Further, a particle counting monitor can be inserted in the vacuum line to detect particles of silicon in the low stream and adjust the flow rate accordingly. In a preferred embodiment, after initial evacuation of the chamber, it is backfilled with argon and re-evacuated to achieve more effective removal of air from the chamber/silicon charge.

During the heat up of the charge in the DSS furnace the residual air in the charge will evolve and can react with the carbon heat zone to form carbon monoxide (CO), which can react with the silicon charge to form silicon carbide (SiC). Because of the high surface area of the powder substantial amounts of SiC can be formed. Further, the silicon powder can have a surface oxide layer. The silicon oxide and silicon carbide have a higher melting temperature than silicon. This condition presents problems in melting the powder. This problem can be minimized by an effective removal of air from the powder, by maintaining faster heat up rates above 1000° C. when silicon to SiC conversion is faster and/or by operating the chamber under vacuum instead of under an argon blanket. A typical heating rate is about 4-6° C./minute until a temperature of 1200° C. and about 1-2° C./minute until a temperature of 1500° C. In accord with certain preferred embodiments of the present invention, after reaching a furnace temperature of about 1000° C., the heating rate is maintained at about 4-6° C./minute.

It should be remembered that vacuum operation can destabilize the release coating on the crucible interior surfaces and, if the chamber is evacuated while silicon is in molten state, it can result in a cracked ingot. However, vacuum operation will help to reduce of the oxide-carbide scum layer which will float on the surface of the melt after complete melting is achieved. Thus, preferably a vacuum is applied to the chamber in the final stages of solidification of the ingot, preferably when at least about 80% of the ingot is solidified, more preferably when about 90% of the ingot is solidified, and most preferably when about 95% of the ingot is solidified. Also, if the ingot is to be used for feed stock to make purer ingots, then, the vacuum can be maintained throughout the process.

After the charge is molten, standard furnace operating procedures can be used. The inherent directional solidification feature of DSS furnaces will reject impurities with low segregation coefficient to the melt (most common impurities in silicon have segregation coefficient less than 1), thereby, producing a purer solid. Most impurities are rejected during solidification of the melt and are captured in the last material to solidify. This material can be removed from the ingot. In DSS grown silicon ingots, the contaminants as well as the oxide-carbide scum typically are captured in a relatively thin layer near the top surface and at the sides of the ingots. This material is typically removed from ingots in any conventional manner, such as by milling or sawing operations, to maintain dimensional accuracy of the bars/wafers produced from the silicon ingot.

In a specific example, silicon powder was loaded into a silicon nitride coated crucible to a level about 1.5 to 2 inches below the top of the crucible. Pieces of silicon were used to cover the powder and reduce the effects of gas outflow and inflow during evacuation, argon backfill, heat up and melt stages of the process. The ingot forming process was carried out in a closed crucible support box to avoid contact of the small amount of powder that may get airborne with the graphite in the furnace. During pumpdown the outlet valve was set to produce a pumpdown rate that would reduce the pressure from ~1000 mBar to ~100 mBar in two hours. The crucible and contents were heated from room temperature to about 1200° C. over about 3.25 hours under vacuum, the chamber was backfilled with argon to 400-800 mbar at a rate of about 12 mBar/min., heating was continued to 1550° C. over about 4.5 hours, then the temperature was held till complete melting, the temperature was maintained above melt point and a temperature gradient was applied to achieve directional solidification over about 18 hours, then, the temperature was reduced below the melting point and the gradient was reduced to achieve annealing of ingot at about 1300° C. for 3.5 hours, followed by cooling down in about 9 hours. Using this cycle, desired solid silicon ingots useful for making photovoltaic cells can be made using powders to produce crack free silicon ingots.

Alternative heating cycles that provide the desired results using powders and produced crack free silicon ingots use a typical heating rate from room temperature to about 1200° C. in a standard run is about 4-6° C./minute and the furnace chamber is maintained under vacuum; for the temperature range of 1200 to 1500° C. the heating rate is typically 1-2° C./minute and the furnace chamber is under an argon blanket with a pressure of 400-800 mbar. Following meltdown the silicon is directionally solidified from the bottom towards the top surface in the well known manner. After complete solidification the temperature gradient on the ingot is reduced to achieve annealing and, thereafter, the ingot is cooled in the furnace. The furnace chamber is maintained for subsequent steps also under argon blanket. In accord with embodiments of the present invention where cracking of the ingot is acceptable, after reaching a furnace temperature of about 1000° C., the heating rate is maintained at about 4-6° C./minute throughout the temperature range of 1200-1500° C./minute while maintaining a vacuum. In these embodiments, the chamber can be maintained under vacuum throughout the entire heating cycle and subsequent steps after meltdown can also be carried out under vacuum.

The present invention has been described in detail, including preferred embodiments. However, it should be recognized that those skilled in the art, upon considering this disclosure, may make modifications and improvements within the spirit and scope of this invention.

What is claimed is:

1. A method for making multicrystalline silicon ingots suitable for photovoltaic use comprises:
   providing a fused silica crucible,
   charging the crucible with silicon feedstock comprising more than about 5% by weight silicon powder of less than about 20 microns in size,
   placing the crucible with the charged silicon feedstock into a furnace chamber,
   drawing a vacuum on the furnace chamber to remove air, the vacuum being applied by reducing the pressure in the range of about 8-15 mBar/min,
   heating the furnace chamber, crucible and silicon feedstock to melt the silicon,
   solidifying the molten silicon to form multicrystalline silicon, and
   cooling the multicrystalline silicon.

2. The method of claim 1, further comprising, before heating, placing the crucible in a box having a graphite bottom plate and graphite side plates, the box further comprising a graphite top plate having a central opening, wherein the side plates also have openings.

3. The method of claim 2, further comprising providing argon through the top plate central opening to exit through the side plate openings.

4. The method of claim 3, further comprising providing graphite tubes in the furnace chamber to direct the argon from an injection point to the central opening of the top plate.

5. The method of claim 1, further comprising after reaching a furnace temperature of about 1000° C., the heating rate is maintained at a rate about 4-6° C./minute.

6. The method of claim 1, further comprising after the heating step, backfilling with argon, and after a partial solidification during the solidifying step, applying another vacuum to evacuate the furnace chamber and crucible.

7. The method of claim 1, further comprising two heating steps, wherein after the first heating step, backfilling with argon, applying another vacuum to evacuate the furnace chamber and crucible again, then, backfilling a second time with argon and providing a second heating step.

8. A method for making multicrystalline silicon ingots suitable for photovoltaic use comprises:
provided a fused silica crucible having a silicon nitride coating,
charging the crucible with silicon feedstock comprising bulk silicon pieces and more than about 5% by weight silicon powder of less than about 20 microns in size,
placing the crucible with the charged silicon feedstock into a furnace chamber,
drawing a vacuum on the furnace chamber to remove air, the vacuum being applied by reducing the pressure in the range of about 8-15 mBar/min,
heating the furnace chamber, crucible and silicon feedstock to melt the silicon,
backfilling the furnace chamber with argon gas,
continued heating the furnace chamber, crucible and silicon feedstock to completely melt the silicon,
solidifying the molten silicon to form multicrystalline silicon, and
annealing the multicrystalline silicon.

9. The method of claim 8, wherein the furnace is a component of a directional solidification system, and further comprising applying a further vacuum after solidification of the silicon is at least about 80% complete.

10. The method of claim 8, further comprising, before heating, placing the crucible in a box having a graphite bottom plate and graphite side plates, the box further comprising a graphite top plate having a central opening, wherein the side plates also have openings so that argon entering through the top plate central opening can exit through the side plate openings, and wherein the argon entering the furnace chamber is directed to the central opening of the top plate.

11. The method of claim 8, further comprising, before heating, placing the crucible in a box having a graphite bottom plate and graphite side plates, the box further comprising a graphite top plate having a central opening, wherein the side plates also have openings.

12. The method of claim 11, further comprising providing argon through the top plate central opening to exit through the side plate openings.

13. The method of claim 12, further comprising providing graphite tubes in the furnace chamber to direct the argon from an injection point to the central opening of the top plate.

14. The method of claim 8, further comprising after backfilling with argon, applying another vacuum to evacuate the furnace chamber and crucible again and, then, backfilling a second time with argon.

* * * * *